(12) United States Patent
Wilson et al.

(10) Patent No.: US 11,561,254 B2
(45) Date of Patent: Jan. 24, 2023

(54) TOPSIDE CONTACT DEVICE AND METHOD FOR CHARACTERIZATION OF HIGH ELECTRON MOBILITY TRANSISTOR (HEMT) HETEROSTRUCTURE ON INSULATING AND SEMI-INSULATING SUBSTRATES

(71) Applicant: SEMILAB Semiconductor Physics Laboratory Co., Ltd., Budapest (HU)

(72) Inventors: Marshall Wilson, Tampa, FL (US); Bret Schrayer, Tampa, FL (US); Alexandre Savtchouk, Tampa, FL (US); Dmitriy Marinskiy, Tampa, FL (US); Jacek Lagowski, Tampa, FL (US)

(73) Assignee: SEMILAB Semiconductor Physics Laboratory Co., Ltd., Budapest (HU)

( * ) Notice: Subject to any disclaimer, the term of this patent is extended or adjusted under 35 U.S.C. 154(b) by 0 days.

(21) Appl. No.: 17/332,952

(22) Filed: May 27, 2021

(65) Prior Publication Data
US 2022/0381816 A1 Dec. 1, 2022

(51) Int. Cl.
*G01R 31/26* (2020.01)
*G01R 31/265* (2006.01)
*G01R 1/067* (2006.01)

(52) U.S. Cl.
CPC ..... *G01R 31/2656* (2013.01); *G01R 1/06727* (2013.01); *G01R 31/2601* (2013.01)

(58) Field of Classification Search
CPC ............ G01R 31/2656; G01R 1/06727; G01R 31/2601; H01L 21/338; H01L 29/778;
(Continued)

(56) References Cited

U.S. PATENT DOCUMENTS 3,943,442 A * 3/1976 Fletcher ............ G01R 31/2637
324/678
5,036,271 A 7/1991 Mazur et al.
(Continued)

OTHER PUBLICATIONS

International Search Report and Written Opinion in International Application No. PCT/US2022/030106, dated Aug. 25, 2022, 15 pages.
(Continued)

*Primary Examiner* — Jermele M Hollington
*Assistant Examiner* — Courtney G McDonnough
(74) *Attorney, Agent, or Firm* — Fish & Richardson P.C.

(57) ABSTRACT

Methods of characterizing electrical properties of a semiconductor layer structure on a wafer with topside semiconductor layers on an insulating or semi-insulating substrate, the semiconductor layer structure including a high electron mobility transistor (HEMT) heterostructure with a two-dimensional electron gas (2DEG) at a heterointerface between the semiconductor layers of the heterostructure. The methods include: (a) physically contacting the topside of the wafer within a narrow border zone at an edge of the wafer with a flexible metal cantilever electrode of a contacting device, wherein the flexible metal cantilever electrode contacts one or more of the semiconductor layers exposed at the narrow border zone so that the flexible metal cantilever electrode is in electrical contact with the 2DEG; and (b) applying corona charge bias and measuring a surface voltage of the semiconductor layers using a non-contact probe while maintaining the electrical contact with the 2DEG. The physical contacting to the topside of the wafer is noncontaminating and noninvasive to the semiconductor layers.

10 Claims, 10 Drawing Sheets

(58) Field of Classification Search
CPC ..... H01L 21/336; H01L 27/06; H01L 29/812; H01L 29/66; H01L 21/335; H01L 29/802
USPC ..... 324/755.07; 257/194, 200; 438/167, 172
See application file for complete search history.

(56) References Cited

U.S. PATENT DOCUMENTS

| | | |
|---|---|---|
| 6,114,865 A | 9/2000 | Lagowski et al. |
| 6,375,748 B1* | 4/2002 | Yudovsky ......... H01L 21/68785 118/728 |
| 9,442,133 B1* | 9/2016 | Chen ...................... G01R 31/44 |
| 2003/0122567 A1 | 7/2003 | Miller et al. |
| 2005/0036266 A1* | 2/2005 | Kato ........................ A61L 9/22 361/231 |
| 2008/0961808 | 3/2008 | Mok et al. |
| 2013/0285688 A1 | 10/2013 | Namburi et al. |
| 2018/0166314 A1* | 6/2018 | Ellis .................... H01L 21/6875 |

OTHER PUBLICATIONS

Wilson et al., "Review-Recent Advancement in Charge-and Photo-Assisted Non-Contact Electrical Characterization of SiC, GaN, and AlGaN/GaN HEMT," Journal of Solid State Science and Technology, Jan. 1, 2017, 13 pages.

\* cited by examiner

TOPSIDE CONTACT DEVICE AND METHOD FOR CHARACTERIZATION OF HIGH ELECTRON MOBILITY TRANSISTOR (HEMT) HETEROSTRUCTURE ON INSULATING AND SEMI-INSULATING SUBSTRATES

TECHNICAL FIELD

This specification generally relates to characterization of electrical properties of semiconductor layers and heterostructure layers and interfaces on insulating and semi-insulating substrates, and more particularly to topside contact devices and methods for characterization of high electron mobility transistor (HEMT) structure on insulating and semi-insulating substrates.

BACKGROUND

Noncontact electrical metrology can be used for performing measurements on semiconductor wafers, and determining electrical properties of materials, layer structures and devices such as those in wide bandgap semiconductor heterostructures including the AlGaN/GaN HEMT (high electron mobility transistor) heterostructure. One measurement technique, referred to as Corona noncontact Capacitance-Voltage, CnCV, can be adapted from silicon characterization tools. The metrology uses corona-charge biasing realized with corona charge deposition on the wafer surface. In response to the deposited charge, $Q_C$, the surface voltage, V, changes and it is measured with the noncontact Kelvin-probe.

Monitoring of heterostructure layers, and the two-dimensional electron gas at the AlGaN/GaN heterointerface involves very accurate measurement of the surface potential and surface voltage drop across the top layers. For that, the noncontact Kelvin-probe measurement is referred to the ground potential as a reference and the potential of the top surface layer is required to be stable with respect to ground. This is easy to satisfy for a wafer with heterostructure layers on a conducting substrate held by vacuum suction on an electrically conducting wafer chuck connected to the ground potential. However, the condition is difficult to satisfy when the heterostructure is on an insulating substrate.

The latter is the case when measuring top surface AlGaN/GaN HEMT heterostructures deposited on an insulating sapphire substrate or on very high resistivity, "semi-insulating" SiC substrates. In this configuration, the top layers are "electrically floating". The floating electrostatic potential is susceptible to various static interferences that deteriorate the measurement accuracy.

The case of floating topside layers on insulating substrates was addressed in relation to Mercury Probe measurements by Mazur et al. in U.S. Pat. No. 5,036,271. They described the topside return contact surrounding the mercury probe capillary. The contact was provided by a flat element pressed against the top layer surface by vacuum suction. In recent applications of the Mercury Probe C-V technique to characterization of AlGaN/GaN HEMT on sapphire and on semi-insulating SiC substrates, the topside return contact was realized using a large mercury contact in addition to the small mercury capillary of the measurement probe. Hazardous contamination involved in the use of mercury creates limitations for applications in modern ultra-clean semiconductor technology.

A solution for the "floating wafer" problem in the corona—Kelvin measurement on silicon wafers with an insulating dielectric layer on the back surface was described by Lagowski, et al., in the U.S. Pat. No. 6,114,865. Their "Device for electrically contacting a floating semiconductor wafer having an insulating layer" included a diamond scriber that created a perforation through the dielectric layer and a probe that contacted the wafer through the perforation. This device can be used effectively in commercial tools for measuring wafers with $SiO_2$ on the back surface. However, such a device may not be useful for contacting topside layers disposed on insulating substrate wafers, such as sapphire or silicon carbide substrates, typically about 0.5 mm thick.

SUMMARY

The disclosure relates to characterization of the electrical properties of semiconductor layers on top of insulating substrate wafers and especially to characterization of AlGaN/GaN HEMT heterostructures on insulating sapphire and semi-insulating SiC substrate wafers. The high electron mobility transistor (HEMT) contains a two-dimensional electron gas (2DEG) at the AlGaN/GaN heterointerface, providing a high mobility channel. In the AlGaN/GaN HEMT fabrication process the hetero-epitaxial deposition of semiconductor layers, including GaN and AlGaN layers, is performed on substrate wafers.

The hetero-epitaxial deposition is followed by processing steps leading to fabrication of chips with HEMT based devices. Conventionally, several processing steps are involved in the fabrication of the special test devices used for characterization of the electrical properties of the 2DEG. Such test devices can include, for example, a metal gate on the top layer of the structure (i.e. the AlGaN or the capping GaN layer) and contact to the 2DEG as needed for biasing of the 2DEG and for acquiring the capacitance voltage C-V characteristics. Characterization based on test devices increases expense and carries a significant time-delay in data feedback.

The invention relates to C-V characterization of electrical properties that can be performed without fabrication of test devices and can be employed for characterization of as-deposited layers, and heterostructure interfaces saving time and expense.

To make it possible, the invention adopted a metrology that employs corona charge bias, instead of the gate bias, and which measures the surface voltage change with a noncontact Kelvin-probe, instead of measuring an ac-capacitance. Moreover, the invention introduced a new element needed for characterization in the case of insulating substrates i.e., a device for making a reliable, noninvasive, temporary electrical contact to the topside layers and the 2DEG.

Three elements can be important for functioning of the topside contact:

1. The location of the contact:

The disclosed devices and methods take advantage of contacting the topside of the wafer in a region located very close to the wafer edge within the very narrow border zone extending a fraction of a mm from the edge, where the epitaxially deposited layers terminate at slightly different positions, making it possible to contact all layers. In the case of circular wafers, with a flat portion of the perimeter, the preferable position for uniform contact is at the flat edge region.

In central positions on the wafer, away from the edge, the layers in AlGaN/GaN. heterostructure overlap each other completely and the contact would be limited to the very top layer, losing good access to the 2DEG.

2. Noninvasive character of the contact:

The disclosed devices and methods use a thin, flexible metal cantilever pressed against the surface in the near edge wafer region to create a good physical contact with layers in the heterostructure, without any perforation, scratching or rubbing against the surface.

3. Metal selection:

With proper selection of the metal with an adequate work function value, the physical contact produces a desired electrical contact. For n-type layers in AlGaN/GaN HEMT, pure Ti with a work function of about 4.3 eV is an appropriate choice of metal for the cantilever.

A reliable topside electric contact can eliminate floating potential effects that can affect measurements of layers on insulating substrates. For example, without a topside electric contact, the layers on insulating substrates are electrically floating. This results in a floating electrostatic surface potential that is susceptible to various static interferences, causing large noise and deterioration of accuracy in measurements based on surface voltage. This problem can be eliminated when the topside contact connects the semiconductor layers to ground potential.

In addition, a reliable topside electrical contact can eliminate effects caused by capacitance of the insulating substrate. In corona charge bias-Kelvin probe measurements with floating top layers, the effective measured capacitance $C_{eff}=\Delta Q/\Delta V$ may be dominated by the substrate capacitance $C_{sub}$ in series with the large HEMT structure capacitance $C_{HEMT}$. For insulating 500 μm substrates, for example, $C_{sub} \ll C_{HEMT}$, thus:

$$1/C_{eff}=1/C_{HEMT}+1/C_{sub}\approx 1/C_{sub}$$

As a result, the measurement loses sensitivity to HEMT properties. The topside connection to ground can effectively short-circuit the substrate capacitor, substantially eliminating the effect of $C_{sub}$.

Corona charge bias is intended to modulate the 2DEG population, with negative charge repelling 2DEG electrons (depleting 2DEG) and positive charge attracting 2DEG electrons (populating 2DEG). However, for effective modulation, a carrier flow path is needed between the 2DEG and ground. Such a path is created by the topside contact.

Various aspects of the invention are summarized as follows:

In general, in one aspect, the invention features methods of characterizing electrical properties of a semiconductor layer structure on a wafer including semiconductor layers disposed on an insulating or semi-insulating substrate, the semiconductor layers being on a topside of the wafer and the semiconductor layer structure including a high electron mobility transistor (HEMT) heterostructure with a two-dimensional electron gas (2DEG) at a heterointerface between the semiconductor layers of the HEMT heterostructure. The methods include:

(a) physically contacting the topside of the wafer within a narrow border zone at an edge of the wafer with a flexible metal cantilever electrode of a contacting device, wherein the flexible metal cantilever electrode contacts one or more of the semiconductor layers of the HEMT heterostructure exposed at the narrow border zone so that the flexible metal cantilever electrode is in electrical contact with the 2DEG of the heterointerface; and (b) applying corona charge bias and measuring a surface voltage of the semiconductor layers using a non-contact probe while maintaining the electrical contact with the 2DEG of the heterointerface.

The physical contacting to the topside of the wafer is noncontaminating and noninvasive to the semiconductor layers.

Implementations of the methods can include one or more of the following features and/or features of other aspects. For example, the electrical contact of the flexible metal cantilever electrode to the 2DEG of the heterointerface electrically can connect the semiconductor layers to a ground potential.

Multiple doses of corona charge can be applied and the surface voltage measured after each dose, and the electrical properties of the semiconductor layers can be characterized based on the surface voltage measurements and doses of corona charge. A capacitance-voltage characteristic of the semiconductor layers can be determined based on the surface voltage measurements and doses of corona charge, and a quality of the topside contact is assessed using a relative standard deviation value of the capacitance in a flat segment of the capacitance-voltage characteristic as a criterion.

The semiconductor layers can include an AlGaN layer on top of a GaN layer, the interface between the AlGaN layer and GaN layer defining a 2DEG of the HEMT heterostructure.

The edge of the wafer can be at a wafer flat.

The wafer can be located on an electrically-conducting wafer chuck. The contacting device can be recessed in the chuck and comprises a moveable post, the cantilever electrode being attached to the post. The method can include actuating the post to raise the flexible metal cantilever electrode above the topmost surface of the wafer during loading and unloading the wafer from the chuck. Physically contacting the topside of the wafer with the flexible metal cantilever electrode can include lowering the post to contact an end portion of the flexible metal cantilever against the topside of the wafer within the border zone at the wafer edge, the flexible metal cantilever extending over the topside of the wafer less than one millimeter from the edge.

In general, in another aspect, the invention features devices for providing a topside electrical contact to a wafer positioned on a chuck. The devices include a post recessed in the chuck and a flexible metal cantilever electrode attached to the top of the post, wherein during wafer loading the post acts as a backstop, aligning the wafer edge and the cantilever electrode to a position where the flexible metal cantilever electrode extends over the narrow border zone at the edge of the wafer.

Embodiments of the device can include one or more of the following features and/or features of the prior aspect. For example, the device can further include a spring coupled to the post opposite the flexible metal cantilever electrode, the spring being configured to apply a force to the post to press the flexible metal cantilever electrode onto the topside surface of the wafer when the device engages the wafer.

The flexible metal cantilever electrode can be a Ti electrode.

The flexible metal cantilever electrode can have a thickness of 100 μm or less.

The flexible metal cantilever electrode can be electrically connected to a switch which, in one state, grounds the flexible metal cantilever electrode.

The flexible metal cantilever electrode can include multiple fingers of different length that during contact each extend a different distance from the edge of the wafer onto the topside surface of the wafer within the narrow border zone.

The device can include a pneumatic actuator coupled to the post and configured to vary an amount the post extends from the chuck.

Among other advantages, the methods and devices disclosed relate to characterization of wide bandgap semiconductors for power and high-speed applications that use high-cost wafers. In this case, the nondestructive, noninvasive, and noncontaminating character of a measurement that saves the wafer for further use, is of significant practical importance. For example, the systems and methods described in this specification can characterize AlGaN/GaN HEMT heterostructures on insulating sapphire and semi-insulating SiC substrate wafers. Other applications can include characterization of thin layers, such as IGZO, on insulating glass substrates.

Among other advantages, implementations can enable highly accurate electrical measurements of semiconductor layers and the interfaces between them for a metrology thus far restricted to wafers with semiconducting substrates. The disclosure overcomes difficulties with floating surface potential issues present in the prior art. It introduces non-invasive, noncontaminating, temporary contacting of the top surface layers near the wafer edge. A small topside contact to the semiconductor layer can extend 1 mm or less from the edge and it is about 10 mm wide.

Implementations described in this specification enable the stabilization of the surface potential of a layer disposed on an insulating substrate. Further, the surface voltage and the response to electrical biasing can be precisely measured and controlled, which is an important factor in semiconductor industry metrologies that are based on the surface voltage measurement. The small edge contact leaves nearly the entire wafer surface untouched and open for measuring any site pattern, allowing for practically whole wafer mapping of electrical parameters.

Further, the topside contact solution described in this specification effectively eliminates the floating surface potential of the wafer topside layer without scribing and perforating the substrate and without hazardous contamination involved in use of a mercury contact. In addition to the elimination of the floating surface potential, the topside near-edge contact opens a current path suppling or removing electrons needed to fill or empty the two-dimensional electron gas at AlGaN/GaN hetero-interfacial potential well. This aspect is generally critical for electrical measurement of HEMT parameters.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

FIG. 7A shows an example of a rectangular electrode plate; FIG. 7B shows an example of a fingered cantilever electrode with three cantilevers providing contact at different distances from the wafer edge.

In the drawings, like symbols indicate like elements.

DETAILED DESCRIPTION

Electrical properties of semiconductor layers on top of insulating or semi-insulating substrates are characterized using a device for electrically contacting topside layers at the edge of a wafer in a temporary, nondestructive way. In particular, noninvasive wafer level testing of electrical properties can be performed without fabrication of MOS structures, test diodes, capacitors, and/or permanent contacts. The topside contacting device includes a movable, flexible metal cantilever electrode to contact a top surface of the wafer near the edge at a prescribed adjustable distance from the edge. This enables contacting the topside of the wafer within a very narrow border zone at wafer edge and electrically accessing the layers and the heterointerfaces as needed for electrical measurements of semiconductor layers on top of insulating substrates.

The cantilever metal generally has a work function value suitable to avoid a high Schottky barrier at the contact, e.g., low, and high work functions for n-type and p-type semiconductor layers, respectively. The device assembly is recessed in the wafer holding chuck of the measuring apparatus. Pneumatic activation is used to position the cantilever "up" for the wafer loading and unloading and "down" for electrically contacting the layers. The latter position is maintained during the measurement, providing an electrical connection via the cantilever to ground or to other elements of the measuring system.

Figure 1A:
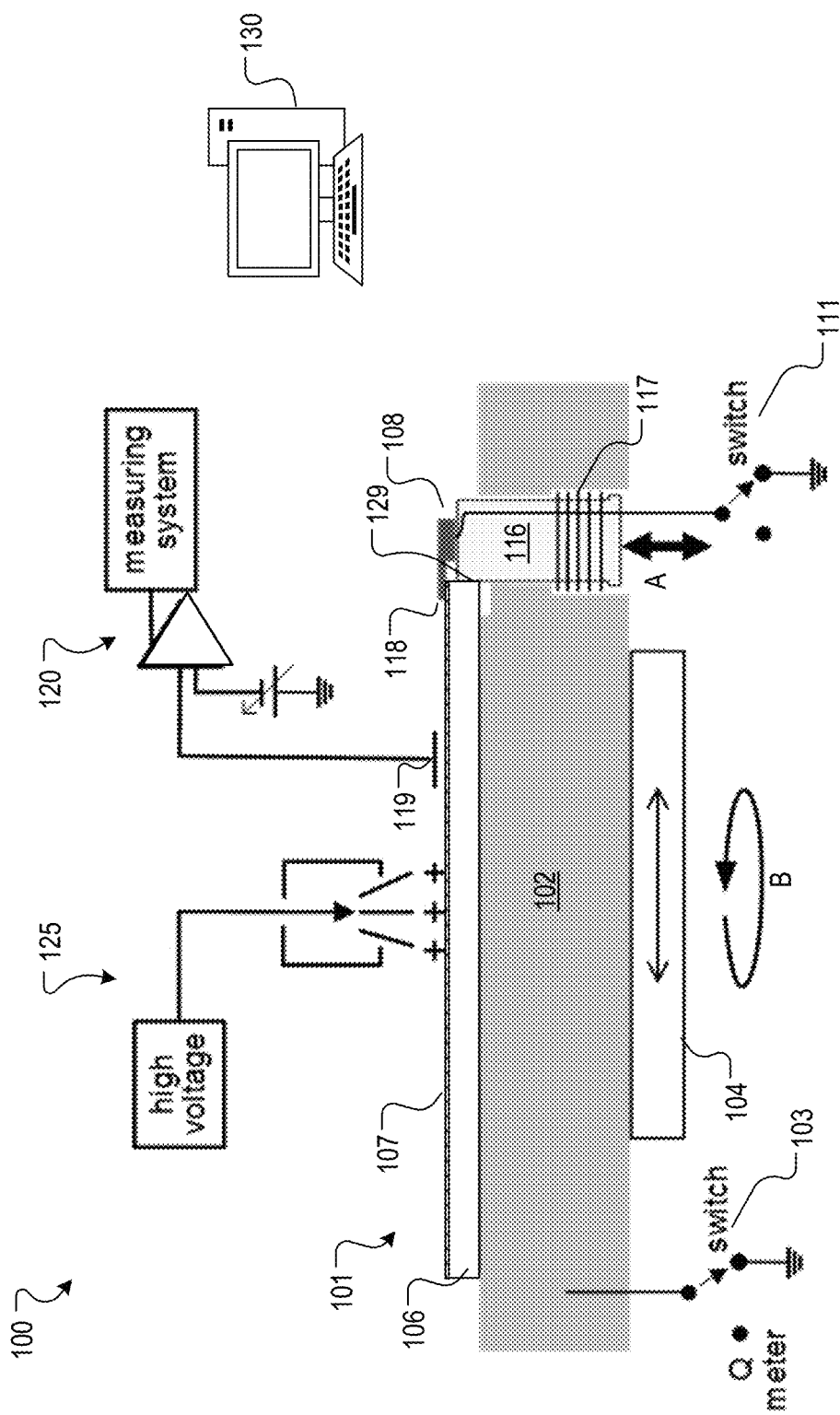
FIG. 1A is a schematic illustration of an apparatus for electrical characterization of semiconductor wafers that incorporates a topside near edge contacting device.

FIG. 1A is a schematic diagram of an example measurement system 100 that includes a topside contacting device 108. The system 100 includes a moveable stage 104 with a chuck 102 for supporting a wafer 101 that includes an insulating or semi-insulating substrate 106 and semiconductor layers 107 on the topside of the substrate 106. The topside contacting device 108 includes a cantilever electrode 118 that contacts the topside of the semiconductor layers 107 and is described in detail below. The chuck 102 is electrically conducting and can be connected to ground using a switch 103. System 100 also includes a corona charge subsystem 125 and a measurement subsystem 120. The system 100 further includes an electronic controller 130 (e.g., a computer) programmed to control operation of the corona charge subsystem 125, the measurement subsystem 120 and the moveable stage 104, as well as actuation of the topside contacting device 108 during loading and unloading of wafer 101 on chuck 102. The measurement subsystem 120 includes a noncontact Kelvin-probe 119 that vibrates above a surface of a wafer 101 and a measurement control unit that records and processes the measurements. The corona charging subsystem 125 includes a voltage source and a discharge electrode that deposits charge on the wafer's 101 surface.

Figure 1B:
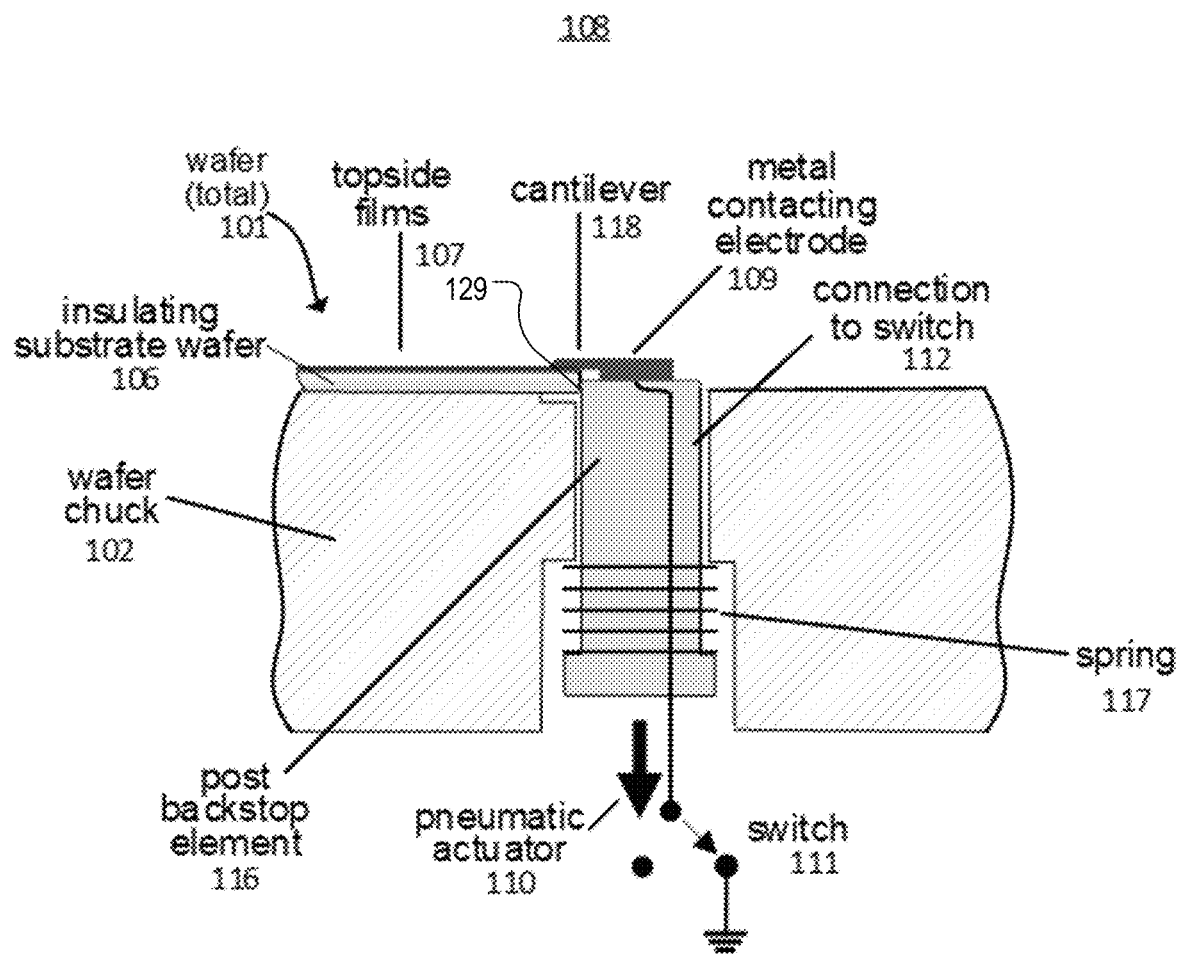
FIG. 1B is a schematic illustration of the device in the contact position with the flexible cantilever down, pressing against the topside surface of the wafer in the contact border zone at the wafer edge.

Referring to FIG. 1B, the contacting device 108 includes a post 116 positioned in a recess of the wafer chuck 102. The post 116 serves as a backstop element for the edge of the wafer at a point of contact 129 between the wafer 101 and the post 116, aligning the edge of the wafer 101 with respect to the cantilever electrode 118 when the wafer is loaded on the wafer chuck 102. Note that for thin layers the edge of the wafer 101 corresponds to the edge of the insulating substrate 106. The post 116 can be made of an insulating plastic material, such as, e.g., vespel plastic, to prevent scratching of the wafer 101. A spring 117 is positioned on the post 116 and is compressed between a flange on the post 116 and a shoulder in the recess in which the post 116 sits. When the topside contacting device 108 is engaged with wafer 101, the spring 117 is compressed, applying a downward force on the cantilever electrode 118, pressing the cantilever electrode 118 against topside layers 107.

Cantilever 118 is part of a metal contacting electrode 109 that is attached to a topside of post 116. The metal contacting electrode 109 is electrically connected via a lead 112 to a switch 111 that can be switched between a ground potential, the wafer chuck 102 and other devices. The cantilever electrode 118 can be relatively thin (e.g., can have a thickness on the order of 100 micrometers) and made of a metal (e.g., Ti). Such a cantilever will generally flex when pressed against a rigid surface, such as the topside surface of wafer 101, and can be applied to such a surface without abrading or otherwise damaging the surface.

The metal used for the cantilever 118 can be selected based on the application. For example, when the layer 107 is a wide band gap semiconductor of n-type, such as the layer in an AlGaN/GaN HEMT structure, the cantilever electrode 118 can be made of pure Ti. In another example, when the layer 107 is a p-type semiconductor, a metal with a high work function value can be used. The cantilever electrode 118 can include an electrical connection to the ground potential of the system 100, or to other elements of the system 100.

A pneumatic actuator 110 moves the post 116 up and down during various phases of operation described below.

The system 100 can include multiple topside contacting devices 108 recessed in the wafer chuck 102. For example, for measurements of different wafer sizes (e.g., 100, 150, and 200 mm diameter wafers), multiple contacting devices 108 can be recessed in the wafer chuck 102 at positions corresponding to different wafer sizes. Each contacting device 108 can be controlled independently.

The system 100 enables characterization of semiconductor layers disposed on insulating or semi-insulating substrates (e.g., AlGaN/GaN HEMT heterostructures on sapphire or semi-insulating SiC substrates). For example, backside electrical contact through the chuck 102 is not present in cases when the wafer substrate is insulating as in the case of sapphire substrates, very high resistivity SiC substrates, or glass substrates. Such a wafer 101 placed on the conducting chuck 102 forms a capacitor wherein the top surface layer 107 is electrically floating. In the case of a HEMT heterostructure on sapphire, measurement with chuck 102 grounded and no additional topside electrical contact would give the sapphire capacitance, i.e., the value corresponding to a capacitor with sapphire as a dielectric. The measurement would give no information on electrical parameters of the HEMT. By contrast, the system 100 can be used to characterize semiconductor layers on insulating or semi-insulating substrates.

The wafer chuck 102 is electrically connected to switch 103 that can be switched between the ground potential and one or more other devices, such as a Q meter, that is a coulombmeter measuring corona deposited charge. In some implementations, the switch 111 can be in a position connecting the metal contacting electrode 109 to the wafer chuck 102. In this position the switching of the metal contacting electrode 109 between the ground potential for surface voltage measurement and a coulombmeter 114 for corona charge monitoring can be achieved using the switch 103.

After corona charging, the stage 104 moves the chuck 102 to position the charged site under the Kelvin-probe 119, switch 103 and 111 are switched to ground, and a voltage is measured on the topside surface of semiconductor layers 107. The corona charging and measurement steps can be repeated. The charge and voltage give the capacitance C, determined as $C=\Delta Q_C/\Delta V$. The corresponding capacitance voltage (C-V), and the metrology unique capacitance-charge C-Q characteristics, are used for determination of the electrical parameters of the layers 107 on the top of the substrate 106 and also the electrical surface and interfacial parameters.

Figure 2:
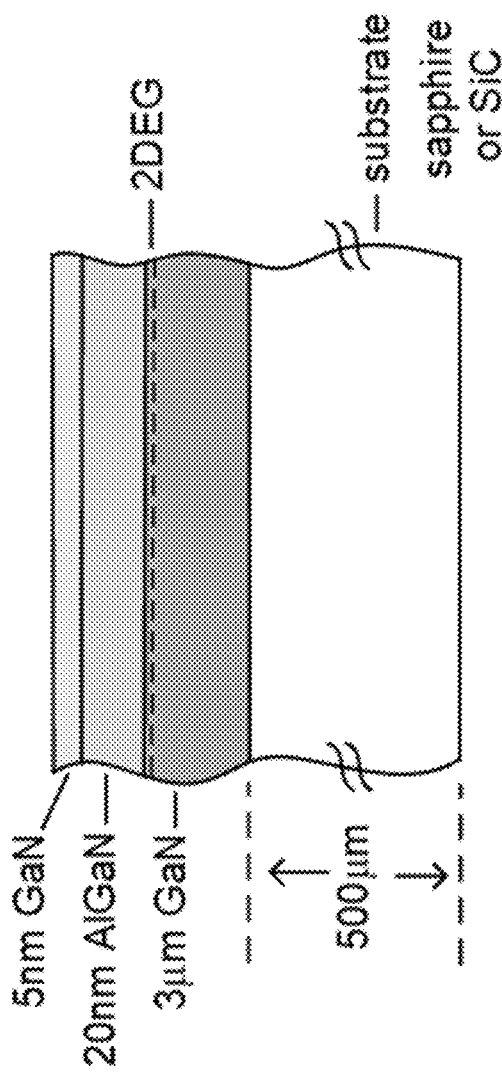
FIG. 2 is a schematic illustration in cross-section of the layers of an AlGaN/GaN HEMT heterostructure with thin semiconductor layers and 2DEG at AlGaN/GaN heterointerface on GaN side on a thick insulating substrate wafer of sapphire or semi-insulating SiC.

FIG. 2 is a cross-sectional view showing typical stacking of layers of GaN/AlGaN/GaN forming a HEMT heterostructure on an insulating or semi-insulating substrate wafer. A two-dimensional electron gas (2DEG) forms at the heterointerface between the lower GaN layer and the AlGaN layer. When such a structure is formed using heteroepitaxial deposition techniques, the individual layers can end at slightly different distances from the edge of the wafer, creating the near-edge border zone with exposed layers and heterointerfacial regions. Topside contact in the present invention is made within this border zone.

Figure 3:
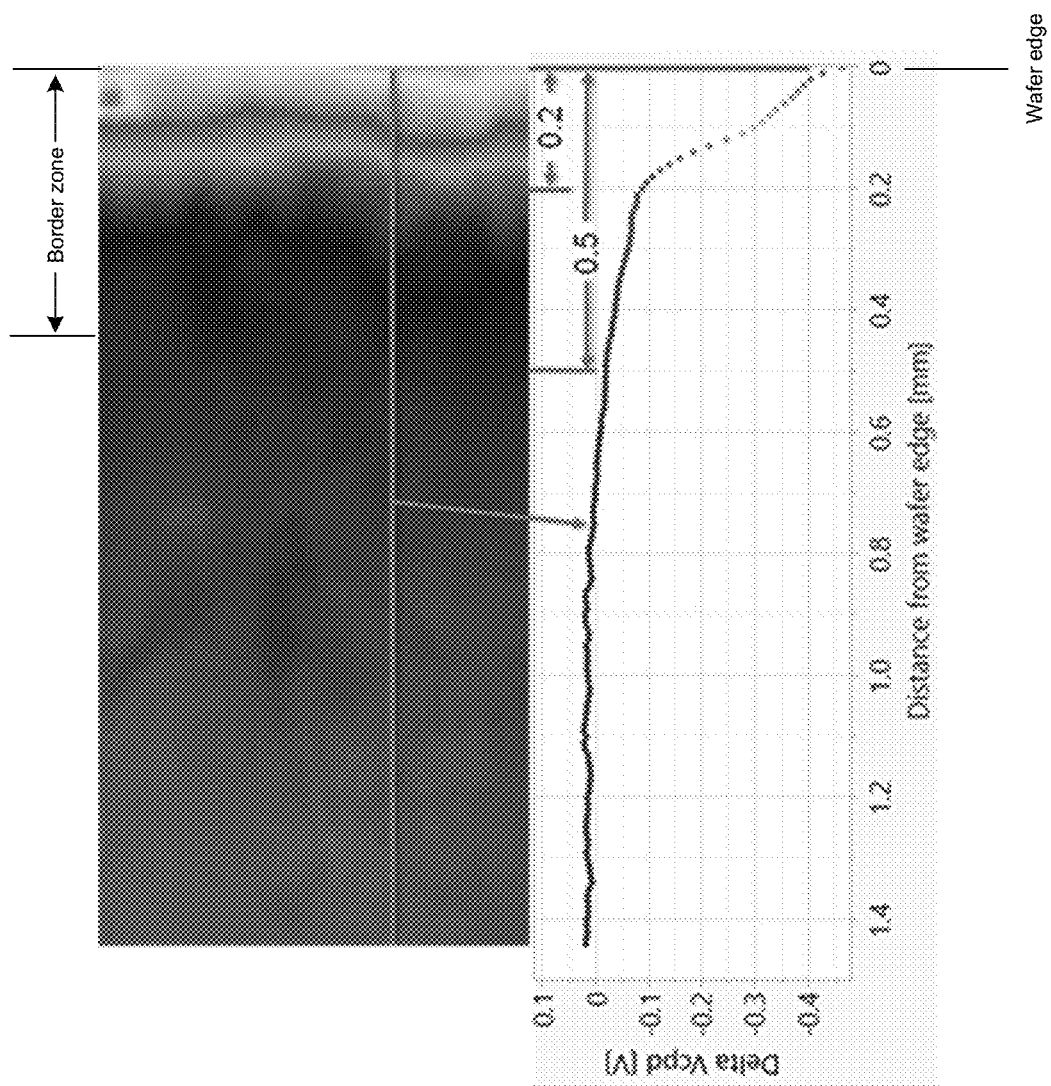
FIG. 3 is a Kelvin Force Microscopy image of the contact potential difference, CPD, showing a topside near edge wafer region of the AlGaN/GaN HEMT structure on an insulating sapphire substrate with layer stacking as shown in FIG. 2. The near edge border zone is present on the entire wafer edge including the wafer flat used for topside contact.

Exposure of different layers in a HEMT structure at the edge of the wafer is illustrated in FIG. 3, which shows a Kelvin Force Microscopy image of the contact potential difference, CPD, showing a 1.45 mm×6 mm topside wafer region near the edge on AlGaN/GaN HEMT structure on insulating sapphire substrate. The layer structure is similar to the layer stacking shown in FIG. 2. The narrow border zone near the wafer edge (e.g., 1 mm or closer) is used as the location of the topside contact. The zone is manifested by decreased CPD values within 0.5 mm from the edge and even stronger decrease within 0.2 mm. Different CPD values correspond to different surface layers of HEMT, starting from the GaN layer away from the edge and AlGaN and 2DEG very near the edge. The near edge border zone is present on the entire wafer edge including the wafer flat used for topside contact.

For characterization of HEMT structures, the contact to the 2DEG at AlGaN/GaN heterointerface is important for supplying and removing electrons from the two-dimensional potential well. This is needed in the corona-Kelvin method of characterization of HEMT heterostructures, where filling and emptying of the potential well is done by positive/negative charge deposition on the top layer surface. Such contact is provided by the flexible cantilever contacting the topside of the wafer within the border zone. The cantilever electrode 118 makes electrical contact with the 2DEG of the AlGaN/GaN heterostructure.

Figure 4B:
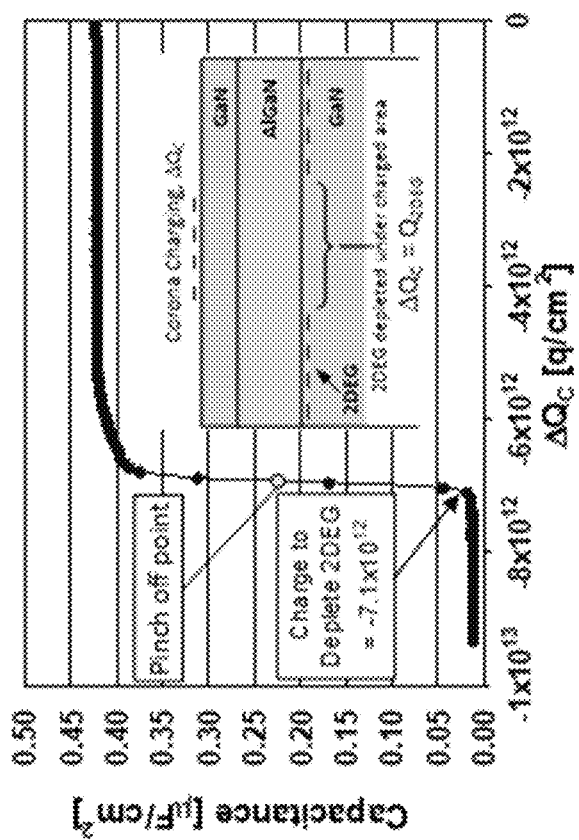
FIGS. 4A and 4B are plots of good quality CnCV results of the electrical characterization of AlGaN/GaN HEMT heterostructure on an insulating substrate measured with the apparatus depicted in FIG. 1 with topside contact of the invention.
Figure 4A:
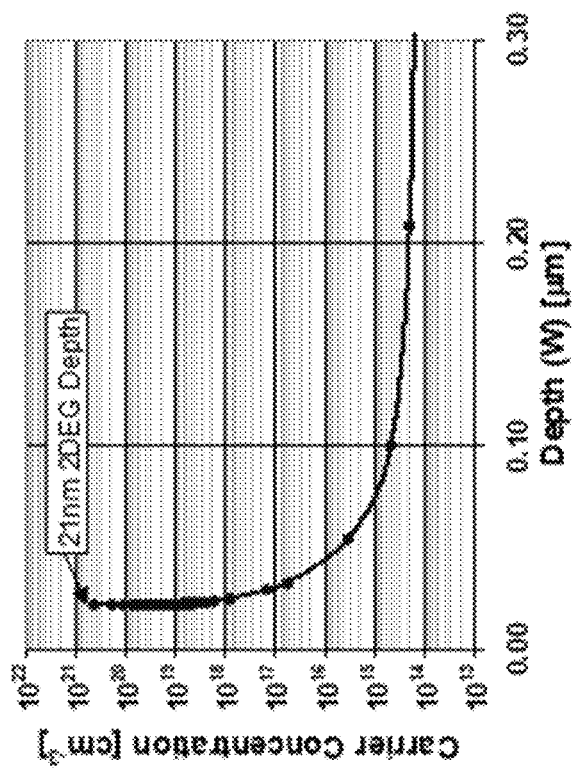

FIGS. 4A and 4B are plots illustrating good quality Corona Capacitance-Voltage measurements characterizing an AlGaN/GaN HEMT heterostructure on an insulating substrate. These results were obtained with a corona charge-Kelvin voltage system as shown in FIG. 1A with topside ground contact in the near edge border zone. In particular, FIG. 4A shows a plot of capacitance as a function of corona charge density. The plot shows a substantial decrease in measured capacitance in the negative charge range of about $-7 \times 10^{12}$ q/cm$^2$, corresponding to the depletion of the 2DEG at the HEMT interface. FIG. 4B shows a plot of carrier concentration as a function of depth below the top surface.

Figure 5:
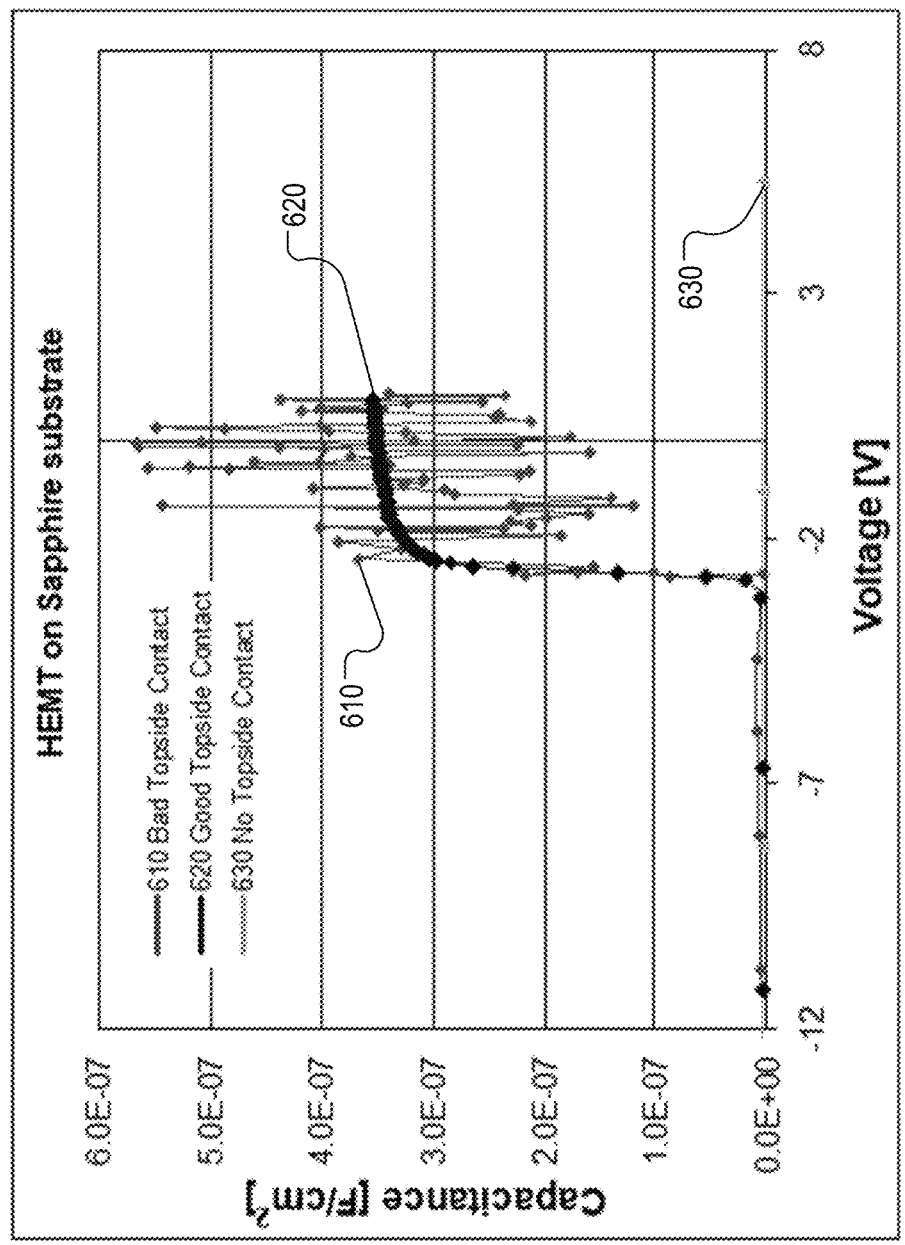
FIG. 5 is a plot presenting capacitance-voltage characteristics of an AlGaN/GaN HEMT on an insulating substrate representative of measurements with bad quality topside contact, good quality topside contact, and without topside contact.

FIG. 5 is a plot showing example characterization measurements of AlGaN/GaN HEMT heterostructures disposed on an insulating substrate. Specifically, FIG. 5 shows capacitance-voltage characteristics of an AlGaN/GaN HEMT on a sapphire substrate for three different cases (610, 620, and 630). The first case 610 includes characterization measurements obtained by using the Corona-Kelvin system (e.g., system 100) with a topside contacting device contacting the wafer, but with the topside contact of inadequate quality. The second case 620 includes characterization measurements obtained by using the Corona-Kelvin system with a topside contacting device contacting the wafer in the near edge border zone, providing good quality contact. The third case 630 includes characterization measurements obtained by using a Corona-Kelvin system without a topside contacting device contacting the wafer. In the latter case, the capacitance is very low since it corresponds to the capacitance of the thick substrate.

The C-V characteristic in case 620 is the desired measurement. It enables highly accurate determination of the AlGaN/GaN HEMT structure parameters, such as: the 2DEG density at AlGaN/GaN heterointerface, the pinch-off voltage value, the free electron density depth profile within the two-dimensional potential well, and also the dopant concentration profile in the bottom GaN layer (the buffer layer).

In the very noisy case 610, the C-V characteristic illustrates measurement results obtained using a topside contact that uses a metal plate contact pressed to the top layer by means of vacuum suction. In this example, the plate was contacting the top layer of an AlGaN/GaN HEMT on sapphire in the vicinity of the Kelvin-probe, however it could not produce smooth C-V characteristics. Similar poor contact results were also obtained using conducting rubber pressed against top layer surface. Good reproducible C-V characteristics were obtained when a flexible cantilever contact near the wafer edge was used, as described herein.

A good topside contact produces a smooth capacitance-voltage characteristic (e.g., 620 in FIG. 5), while a bad quality contact will result in a noisy characteristic with large fluctuation in capacitance values (e.g., 610 in FIG. 5). The system can quantify the magnitude of the fluctuation and uses the relative standard deviation value in a segment of C-V characteristic, or C-Q characteristic as the indicator of topside contact quality. For instance, in a flat capacitance segment with ten measurement data points the 1 sigma relative value of 0.5% or less may be treated as a criterion of adequate top contact quality.

Top contact evaluation can also be achieved using an apparatus with two similar contacts placed on the same wafer flat at a certain distance between them. In such an arrangement, the switch 111 can be switched to positions for resistance measurement between these two contacts for a given top side semiconductor layer. This resistance value can be used as a parameter in a top contact specification for given layers.

Top contact quality verification can be performed during tool maintenance. However, it can also be included in an actual C-V measurement cycle. The standard deviation test can be performed on actual measured wafers as a part of the measurement presetting procedure.

The test can also be performed on reference wafers representing specific top side semiconductor layers disposed on specific insulating substrates according to the needs of different device fabrication lines.

As noted above, topside contact device 108 includes a pneumatic actuator 110 that moves the post 116 up and down to facilitate loading and unloading the wafer 101 and stowing the cantilever electrode 118. These positions are illustrated in FIGS. 6A, 6B, and 6C, which shows the device 108 in the position "up" before and during wafer loading (FIGS. 6A and 6B) and in a neutral down position with the top of cantilever and the electrode leveled with the surface of the wafer chuck (FIG. 6C).

Figure 6A:
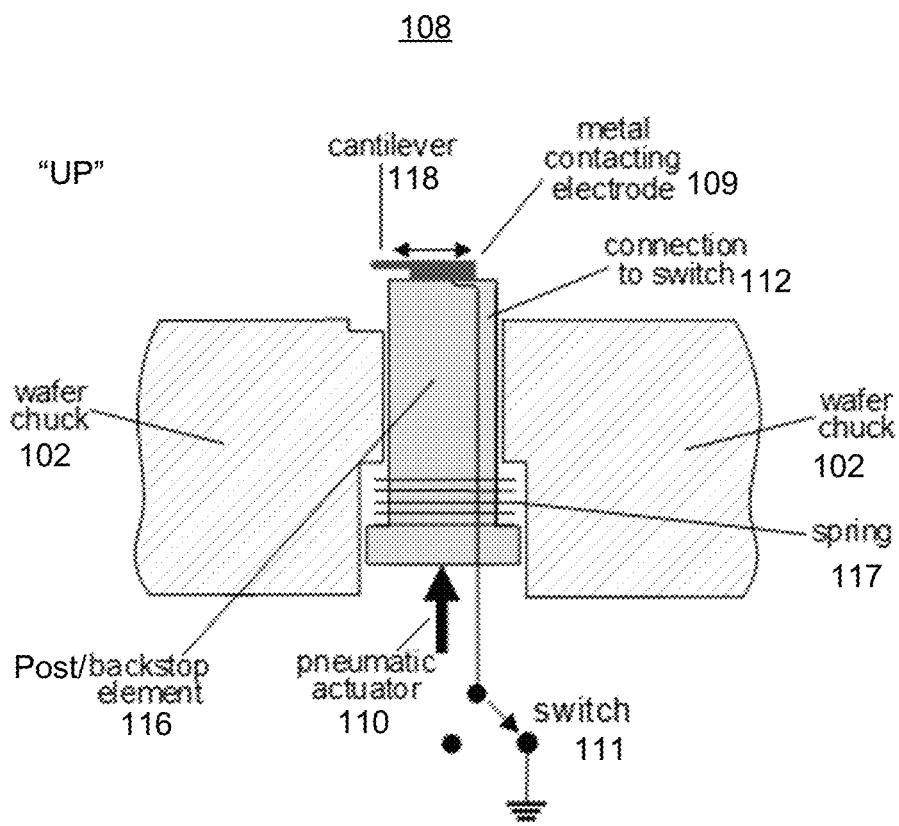
FIG. 6A is a schematic illustration of a contacting device recessed in a wafer chuck. The device is in the "up" position before wafer loading.
Figure 6B:
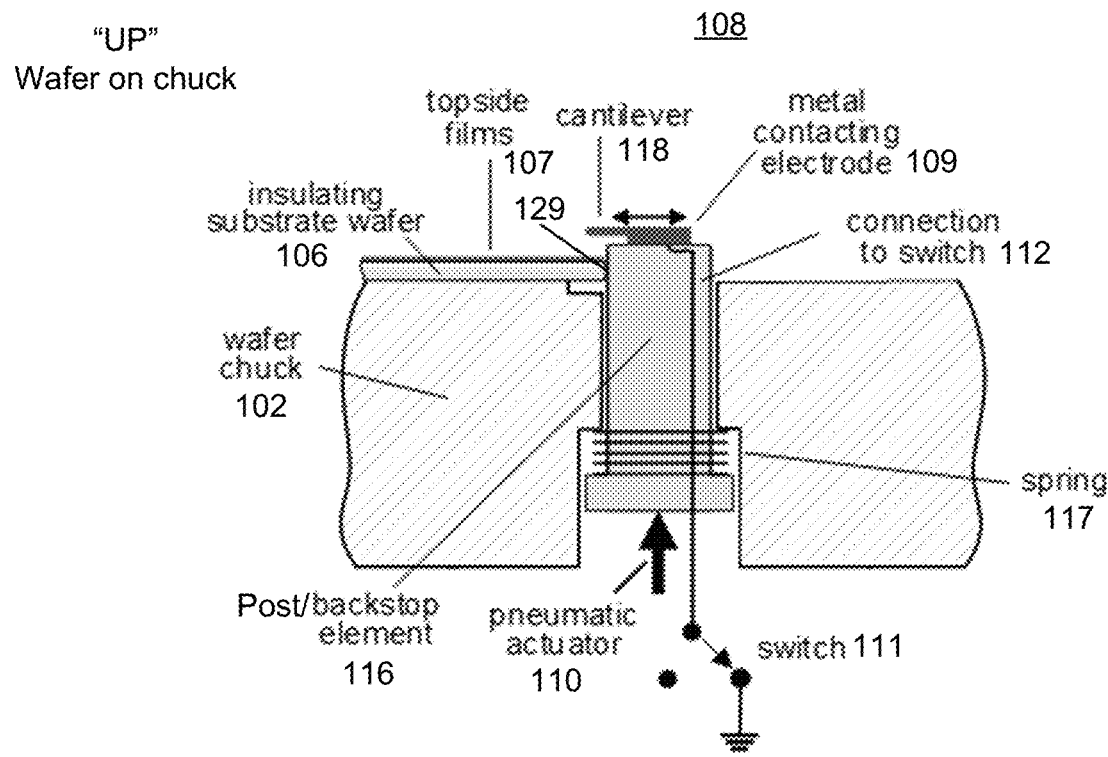
FIG. 6B is a schematic illustration of the device in the "up" position during wafer loading with the wafer positioned on the chuck with respect to cantilever as defined by the backstop element. The device "up" position is also used for the wafer unloading.
Figure 6C:
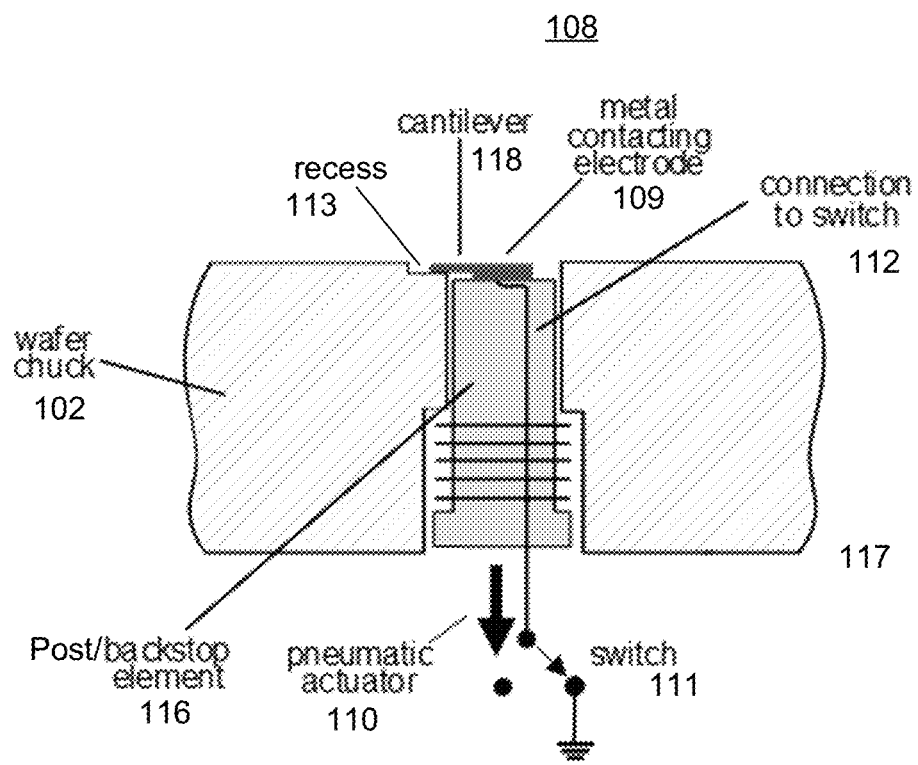
FIG. 6C is a schematic illustration of the device in a neutral down position with the top of cantilever and the electrode leveled with the surface of the wafer chuck.

In FIG. 6A, the pneumatic actuator moves post 116 up so that the cantilever electrode 118 has sufficient clearance from the top of the chuck 102 to allow a wafer to be loaded onto chuck 102 (or unloaded from the chuck) without contacting the cantilever electrode 118. For example, the post 116 can be moved so that the cantilever electrode is 5 mm or more above the top surface of the chuck 102. FIG. 6B shows the post 116 in the same position as in FIG. 6A, but with a wafer loaded onto the chuck. Once a wafer is loaded, the pneumatic actuator 111 moves the post 116 down and a decompression of spring 117 forces the cantilever electrode 118 to contact the top surface of the wafer in the border zone near the edge of the wafer with a predesigned contact force at a small distance from the edge. The post 116 serves as a back-stop to the wafer, contacting the edge of the wafer at point 129, and the use of a suitable plastic material for the post prevents scratching of the wafer edge during the downward motion.

When the contacting is not in use, the actuator can move post 116 down so that the cantilever electrode 118 is retracted into a recess 113 in the chuck 102, the top surface of the cantilever electrode 118 being flush with or beneath the top surface of the chuck 102. This can allow wafers to be positioned over the topside contacting device 108, e.g., that is important for apparatus 100 measuring wafers with multiple sizes and using multiple contacting devices 108, positioned in the chuck 102 accordingly to wafer sizes i.e., such as a 100 mm, 150 mm, or 200 mm diameter.

Figure 7A:
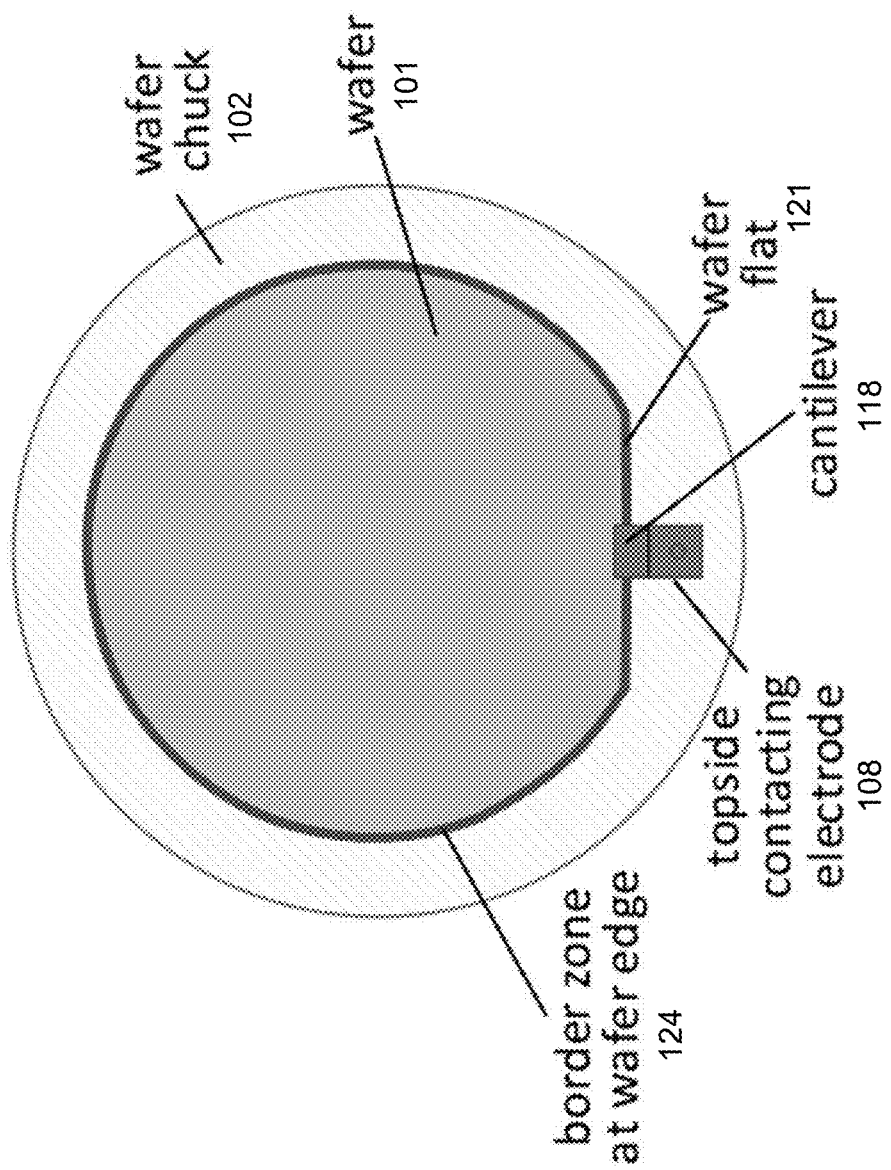
FIGS. 7A and 7B are schematic top views of the cantilever metal electrode contacting a wafer at the border zone. The border zone is present near the wafer edge on the entire wafer including the wafer flat. The contact is made at the flat edge portion of the wafer placed on the wafer chuck.

Conventional wafers are typically circular in shape and have standardized wafer flats. Comparing the quality of topside contact at the circular edge and at the flat edge, the inventors have discovered that consistently good quality topside contact is achieved at the wafer flat edge. When contacting the wafer flat edge, the cantilever electrode is positioned with the width parallel to the wafer flat providing a uniform physical contact over the entire contact width, typically 10 mm. Such an arrangement is shown in FIG. 7A, in which a wafer 101 is positioned on a chuck 102 with its flat edge 121 back-stopped against the post of a topside contact device 108. Device 108 includes a rectangular cantilever electrode 118 that is 10 mm wide and 1.2 mm long which extends 0.5 mm onto the top surface of the wafer 701. Generally, cantilever electrode 118 extends only a short distance over the top surface of the wafer 101, providing electrical contact with the narrow border zone 104 at the wafer flat edge 121. While in the present example the cantilever electrode extends 0.5 mm, the electrode can be adjusted to positions 1 mm or less from the wafer edge until sufficient contact the narrow border zone.

Figure 7B:
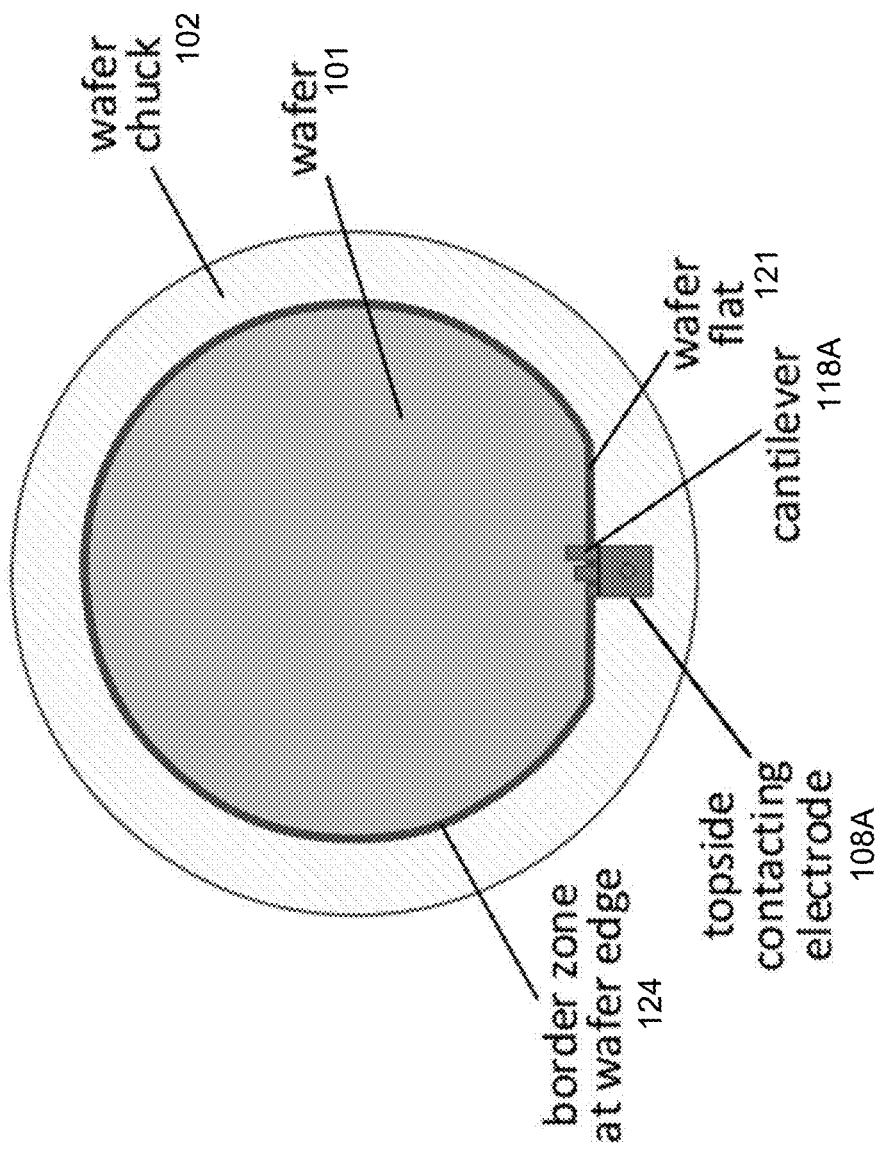

Other cantilever electrode geometries are possible. For example, referring to FIG. 7B, a topside contact device 108A includes a cantilever electrode 118A that includes multiple fingers of different length each contacting the top surface of wafer 101 within a different distance from the wafer flat edge 121 of the wafer 101.

For example, a first finger can extend 0.3 mm from the edge at the wafer flat 121, a second finger can extend 0.5 mm from the edge 121, and a third finger can extend 0.8 mm from the edge 121, therefore contacting different regions of the border zone 124 is achieved. More generally, a cantilever can include other numbers of fingers (e.g., two, four, five, or more), extend different distances, and the fingers can have shapes other that the rectangular shape shown in FIG. 7A.

Including fingers of differing length in a cantilever electrode can result in different pressure of individual fingers that can benefit the electrical contact to multiple layers of semiconductors within the heterostructure.

A number of embodiments have been described. Other embodiments are in the following claims.

What is claimed is:

1. A method of characterizing electrical properties of a semiconductor layer structure on a wafer comprising semiconductor layers disposed on an insulating or semi-insulating substrate, the semiconductor layers being on a topside of the wafer and the semiconductor layer structure comprising a high electron mobility transistor (HEMT) heterostructure with a two-dimensional electron gas (2DEG) at a heterointerface between the semiconductor layers of the HEMT heterostructure, the method comprising:

physically contacting the topside of the wafer within a narrow border zone at an edge of the wafer with a flexible metal cantilever electrode of a contacting device, wherein the flexible metal cantilever electrode contacts one or more of the semiconductor layers of the HEMT heterostructure exposed at the narrow border zone so that the flexible metal cantilever electrode is in electrical contact with the 2DEG of the heterointerface; and applying corona charge bias and measuring a surface voltage of the semiconductor layers using a non-contact probe while maintaining the electrical contact with the 2DEG of the heterointerface, wherein the physical contacting to the topside of the wafer is noncontaminating and noninvasive to the semiconductor layers.

2. The method of claim 1, wherein the electrical contact of the flexible metal cantilever electrode to the 2DEG of the heterointerface electrically connects the semiconductor layers to a ground potential.

3. The method of claim 1, wherein multiple doses of corona charge are applied and the surface voltage is measured after each dose, and the electrical properties of the semiconductor layers are characterized based on the surface voltage measurements and doses of corona charge.

4. The method of claim 3, wherein a capacitance-voltage characteristic of the semiconductor layers is determined based on the surface voltage measurements and doses of corona charge, and a quality of the topside contact is assessed using a relative standard deviation value of the capacitance in a flat segment of the capacitance-voltage characteristic as a criterion.

5. The method of claim 1, wherein the semiconductor layers comprise an AlGaN layer on top of a GaN layer, the interface between the AlGaN layer and GaN layer defining a 2DEG of the HEMT heterostructure.

6. The method of claim 1, wherein the edge of the wafer is at a wafer flat.

7. The method of claim 1, wherein the wafer is located on an electrically-conducting wafer chuck.

8. The method of claim 7, wherein the contacting device is recessed in the chuck and comprises a moveable post, the cantilever electrode being attached to the post.

9. The method of claim 8, further comprising actuating the post to raise the flexible metal cantilever electrode above the topmost surface of the wafer during loading and unloading the wafer from the chuck.

10. The method of claim 8, wherein physically contacting the topside of the wafer with the flexible metal cantilever electrode comprises lowering the post to contact an end portion of the flexible metal cantilever against the topside of the wafer within the border zone at the wafer edge, the flexible metal cantilever extending over the topside of the wafer less than one millimeter from the edge.

* * * * *